United States Patent
He et al.

(10) Patent No.: US 10,679,851 B2
(45) Date of Patent: Jun. 9, 2020

(54) POLY-SILICON THIN FILM AND PREPARATION METHOD OF THIN FILM TRANSISTOR

(71) Applicant: Wuhan China Star Optoelectronics Technology Co., Ltd., Wuhan, Hubei (CN)

(72) Inventors: Peng He, Guangdong (CN); Hongping Yu, Guangdong (CN)

(73) Assignee: Wuhan China Star Optoelectronics Technology Co., Ltd., Wuhan (CN)

(*) Notice: Subject to any disclaimer, the term of this patent is extended or adjusted under 35 U.S.C. 154(b) by 0 days.

(21) Appl. No.: 16/214,172

(22) Filed: Dec. 10, 2018

(65) Prior Publication Data

US 2020/0035490 A1 Jan. 30, 2020

Related U.S. Application Data

(63) Continuation of application No. PCT/CN2018/107447, filed on Sep. 26, 2018.

(30) Foreign Application Priority Data

Jul. 25, 2018 (CN) .......................... 2018 1 0827786

(51) Int. Cl.
*H01L 21/84* (2006.01)
*H01L 21/02* (2006.01)
(Continued)

(52) U.S. Cl.
CPC .... *H01L 21/02675* (2013.01); *H01L 21/0217* (2013.01); *H01L 21/0262* (2013.01);
(Continued)

(58) Field of Classification Search
CPC ......... H01L 21/02675; H01L 21/02532; H01L 21/0262; H01L 29/78675; H01L 29/78603;
(Continued)

(56) References Cited

U.S. PATENT DOCUMENTS 6,818,967 B2* 11/2004 Chen ................. H01L 29/78675
257/359
8,735,077 B2* 5/2014 Shim ..................... B82Y 15/00
435/7.1
(Continued)

FOREIGN PATENT DOCUMENTS

CN 1113032 A 12/1995
CN 101665905 A 3/2010
(Continued)

OTHER PUBLICATIONS

First Office Action of counterpart Chinese patent Application No. 201810827786.2 dated Mar. 26, 2020.

*Primary Examiner* — Vu A Vu

(57) ABSTRACT

The present disclosure provides a poly-silicon thin film and a preparation method of a thin film transistor, the method including: providing a substrate, and forming an amorphous silicon thin film on the substrate; placing the amorphous silicon thin film in air for oxidization so as to form an oxide film on the amorphous silicon thin film; etching the oxide film with hydrofluoric acid, and reserving part of the oxide film after etching; and carrying out excimer laser treatment on the amorphous silicon thin film to form a poly-silicon thin film.

17 Claims, 5 Drawing Sheets

(51) Int. Cl.
*H01L 21/285* (2006.01)
*H01L 21/311* (2006.01)
*H01L 29/66* (2006.01)
*H01L 29/786* (2006.01)

(52) U.S. Cl.
CPC .. *H01L 21/02164* (2013.01); *H01L 21/02238* (2013.01); *H01L 21/02488* (2013.01); *H01L 21/02532* (2013.01); *H01L 21/02592* (2013.01); *H01L 21/28525* (2013.01); *H01L 21/28568* (2013.01); *H01L 21/31111* (2013.01); *H01L 29/66757* (2013.01); *H01L 29/78603* (2013.01); *H01L 29/78633* (2013.01); *H01L 29/78675* (2013.01)

(58) Field of Classification Search
CPC ......... H01L 21/02488; H01L 21/02164; H01L 21/0217; H01L 29/78633; H01L 29/66757; H01L 21/31111; H01L 21/02238; H01L 21/02592; H01L 21/28525; H01L 21/2856
USPC ........................................................ 438/166
See application file for complete search history.

(56) References Cited

U.S. PATENT DOCUMENTS

2014/0057419 A1* 2/2014 Tian .................. H01L 21/02436
                                                                                     438/487
2016/0343828 A1* 11/2016 Hsu .................... H01L 29/78621
2018/0155237 A1 6/2018 Li

FOREIGN PATENT DOCUMENTS

| CN | 103361734 A | 10/2013 |
|----|-------------|---------|
| CN | 105140114 A | 12/2015 |
| JP | 2010278095 A | 12/2010 |
| KR | 1020030059936 A | 7/2003 |
| KR | 1020060057973 A | 5/2006 |

* cited by examiner

R=11.5 nm

R=5.6 nm

R=7.6 nm

POLY-SILICON THIN FILM AND PREPARATION METHOD OF THIN FILM TRANSISTOR

CROSS REFERENCE TO RELATED APPLICATIONS

The present application is a continuation-application conversion of International (PCT) Patent Application No. PCT/CN2018/107447 filed on Sep. 26, 2018, which claims foreign priority of Chinese Patent Application No. 201810827786.2, filed on Jul. 25, 2018 in the State Intellectual Property Office of China, the contents of all of which are hereby incorporated by reference.

TECHNICAL FIELD

This application relates to the technical field of display, in particular to a poly-silicon thin film and a preparation method of a thin film transistor.

BACKGROUND

With the advantages of high image quality, power saving, thin bodies, wide application range and the like, liquid crystal displays (LCDs) have been widely applied to various consumer electronic products such as mobile phones, televisions, personal digital assistants, digital cameras, notebook computers and desk computers, and have become the mainstream of display devices. The LCDs are based on the amorphous silicon (A-Si) display technique or the low-temperature poly-silicon (LTPS) display technique, and LTPS has the advantages over A-Si of high resolution, wide view of angle and the like. In the long-time research and development process, the inventor of this application realized that poly-silicon (poly-Si), prepared through traditional processes, in LTPS products is high in surface roughness, consequentially, affecting the reliability of the products.

Particularly, according to one preparation method, after an amorphous silicon thin film is formed, an oxide film naturally formed on a surface of the amorphous silicon thin film is completely etched away with hydrofluoric acid; and then oxidization is carried out with ozone to form a new oxide film; after the amorphous silicon thin film is dried, excimer laser treatment is carried out on the amorphous silicon thin film to obtain a poly-silicon thin film. However, the poly-silicon thin film obtained through this method is high in surface roughness, for instance, the roughness R of the poly-silicon thin film reaches 11.5 nm. Please refer to FIG. 1 for details, FIG. 1 is a schematic view of a surface of a poly-silicon thin film in the related art.

Particularly, according to another preparation method, after an amorphous silicon thin film is formed, an oxide film naturally formed on a surface of the amorphous silicon thin film is completely etched away with hydrofluoric acid; then excimer laser treatment is carried out on the amorphous silicon thin film twice, and after excimer laser treatment is carried out on the amorphous silicon thin film for the first time, a uniform and thin oxide film is formed on the surface of the amorphous silicon thin film, specifically, during the first time of excimer laser treatment, the amorphous silicon thin film is rapidly scanned with lasers in an atmosphere containing a small quantity of oxygen so as to form the oxide film, and then excimer laser treatment is carried out on the amorphous silicon thin film for the second time to form a poly-silicon thin film. The oxide film formed through this method is thin, and the roughness is reduced by shortening the extrusion time in the recrystallization process (namely reducing protrusions), for instance, the roughness R is 5.6 nm. Please refer to FIG. 2 for details, FIG. 2 is a schematic view of a surface of another poly-silicon thin film in the related art. However, this method has a high cost.

SUMMARY

The technical problem to be solved by the present disclosure is to provide a poly-silicon thin film and a preparation method of a thin film transistor, which are used to reduce the surface roughness of the poly-silicon thin film.

In order to solve the above-mentioned technical problem, a technical scheme adopted by the present disclosure is: providing a preparation method of a poly-silicon thin film, comprising: providing a substrate, and forming an amorphous silicon thin film on the substrate; placing the amorphous silicon thin film in an air environment with a cleanliness smaller than or equal to level 1000 for oxidization so as to form an oxide film on the amorphous silicon thin film; etching the oxide film with hydrofluoric acid, and reserving part of the oxide film after etching, wherein the concentration of hydrofluoric acid is 0.21-0.35%/40 s, the conveying speed of the substrate 401 is 7000-9000 R/min; and carrying out excimer laser treatment on the amorphous silicon thin film to form a poly-silicon thin film.

In order to solve the above-mentioned technical problem, another technical scheme adopted by the present disclosure is: providing a preparation method of a poly-silicon thin film, comprising: providing a substrate, and forming an amorphous silicon thin film on the substrate; placing the amorphous silicon thin film in air for oxidization so as to form an oxide film on the amorphous silicon thin film; etching the oxide film with hydrofluoric acid, and reserving part of the oxide film after etching; and carrying out excimer laser treatment on the amorphous silicon thin film to form a poly-silicon thin film.

In order to solve the above-mentioned technical problem, also a technical scheme adopted by the present disclosure is: providing a preparation method of a thin film transistor, comprising: providing a substrate, and forming a poly-silicon thin film on the substrate; wherein the forming the poly-silicon thin film on the substrate comprises: forming an amorphous silicon thin film on the substrate; placing the amorphous silicon thin film in air for oxidization so as to form an oxide film on the amorphous silicon thin film; etching the oxide film with hydrofluoric acid, and reserving part of the oxide film after etching; and carrying out excimer laser treatment on the amorphous silicon thin film to form the poly-silicon thin film.

The embodiments of the present disclosure provide a preparation method of a poly-silicon thin film, by naturally forming the oxide film in air, the surface roughness of the poly-silicon thin film can be reduced.

DETAILED DESCRIPTION

Technical proposals of embodiments of the present disclosure will be described clearly and completely below. Apparently, the described embodiments are merely part of, rather than all of the embodiments of the present disclosure. Based on the described embodiments of the present disclosure, any other embodiment obtained by a person skilled in the art without paying creative efforts shall also fall within the scope of the present disclosure.

The present disclosure provides a preparation method of a poly-silicon thin film, which is used to reduce the surface roughness of the poly-silicon thin film though changing the manufacture process of an oxide film.

Figure 1:
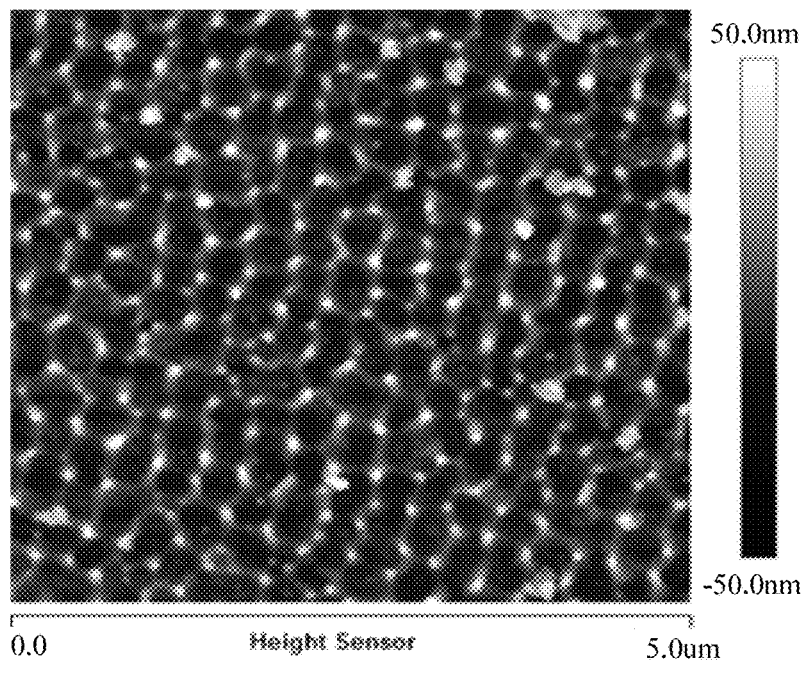
FIG. 1 is a schematic view of a surface of a poly-silicon thin film in the related art.
Figure 2:
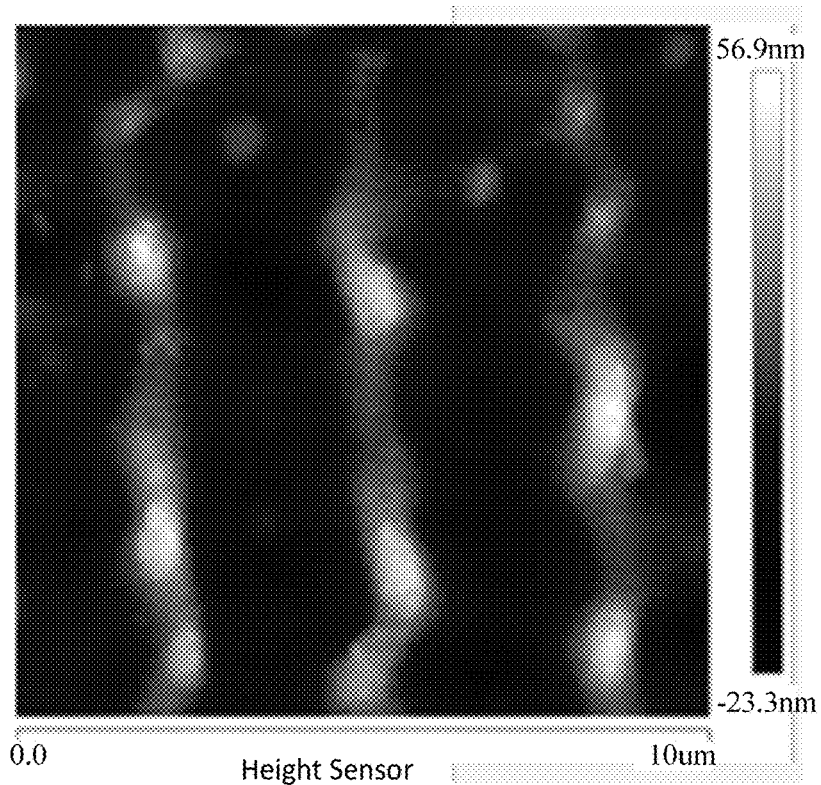
FIG. 2 is a schematic view of a surface of another poly-silicon thin film in the related art.
Figure 3:
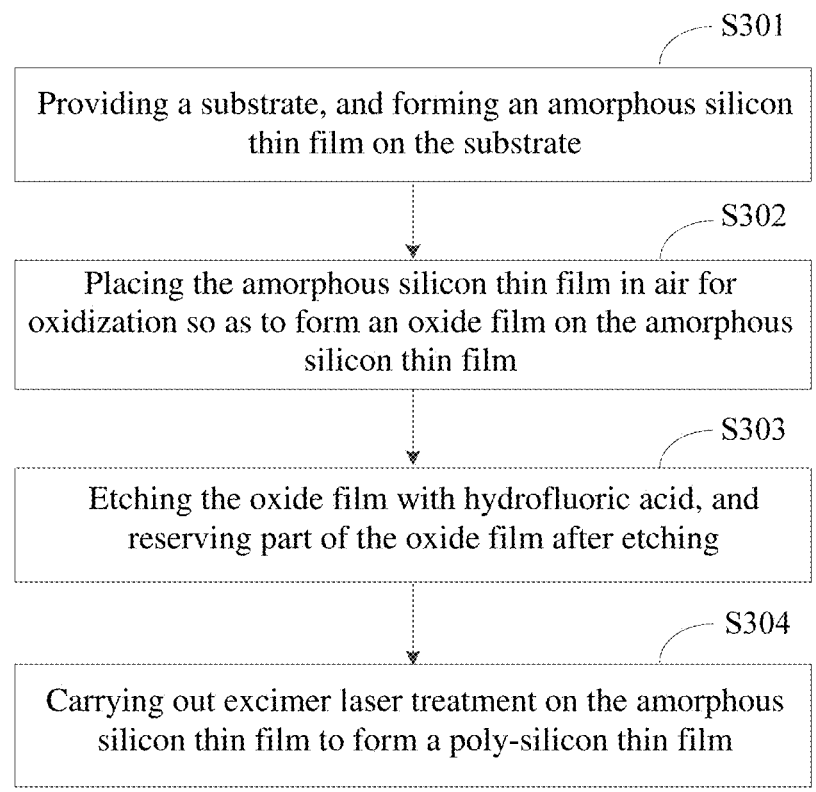
FIG. 3 is a flow diagram of a first embodiment of a poly-silicon thin film preparation method of this application.

Referring to FIG. 3, FIG. 3 is a flow diagram of a first embodiment of a poly-silicon thin film preparation method of this application. In one embodiment, a poly-silicon thin film preparation method may include the following blocks:

S301, providing a substrate, and forming an amorphous silicon thin film on the substrate.

The substrate may be a glass substrate or a flexible substrate. The amorphous silicon thin film may be deposited on the substrate through chemical vapor deposition (CVD). In other embodiments, the amorphous silicon thin film may be formed in other ways such as physical deposition.

S302, placing the amorphous silicon thin film in air for oxidization so as to form an oxide film on the amorphous silicon thin film.

The amorphous silicon thin film may be directly exposed in air, so that the oxide film is naturally formed on the amorphous silicon thin film.

S303, etching the oxide film with hydrofluoric acid, and reserving part of the oxide film after etching.

The oxide film may be etched with low-concentration hydrofluoric acid, so that the etching speed is controlled to regulate and control the thickness of the rest of the oxide film.

S304, carrying out excimer laser treatment on the amorphous silicon thin film to form a poly-silicon thin film.

Radiation treatment may be carried out on the amorphous silicon thin film with excimer lasers, so that the surface of the amorphous silicon thin film instantly reaches a high temperature to be molten, and then amorphous silicon in the molten state may be annealed to be crystallized to form the poly-silicon thin film.

In this embodiment, the way to form the oxide film is changed. By naturally forming the oxide film in air, the surface roughness of the poly-silicon thin film can be reduced.

Figure 4:
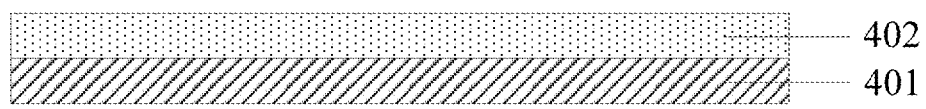
FIG. 4 is a schematic diagram of an amorphous silicon thin film formed through the poly-silicon thin film preparation method of this application.

Referring to FIGS. 4-8, in another embodiment, the poly-silicon thin film preparation method may include the following blocks:

Referring to FIG. 4, FIG. 4 is a schematic diagram of an amorphous silicon thin film formed through the poly-silicon thin film preparation method of this application. Providing a substrate 401, and forming an amorphous silicon thin film 402 on the substrate 401, wherein the substrate 401 may be a glass substrate or a flexible substrate, and the amorphous silicon thin film 402 may be deposited on the substrate through CVD.

Figure 5:
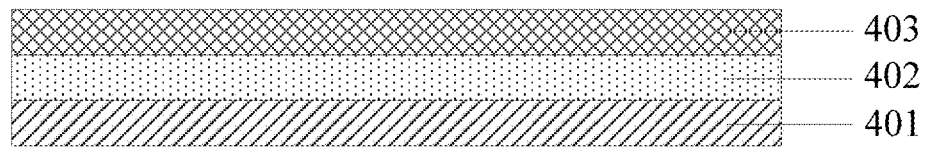
FIG. 5 is a schematic diagram of an oxide film formed through the poly-silicon thin film preparation method of this application.

Referring to FIG. 5, FIG. 5 is a schematic diagram of an oxide film formed through the poly-silicon thin film preparation method of this application. Placing the amorphous silicon thin film 402 in air for oxidization so as to form an oxide film 403 on the amorphous silicon thin film 402.

As shown in FIG. 5, FIG. 5 is a schematic diagram of an oxide film formed through the poly-silicon thin film preparation method of this application. Placing the amorphous silicon thin film 402 in air for oxidization so as to form an oxide film 403 on the amorphous silicon thin film 402.

Particularly, the amorphous silicon thin film 402 may be placed in an air environment with a cleanliness smaller than or equal to level 1000 so as to be subjected to an oxidization reaction. Wherein the cleanliness indicates the dust content of air in the air environment and generally refers to the quantity of particles, with sizes greater than or equal to a certain particle size, in a unit volume of air. If the dust content is high, the cleanliness is low; and if the dust content is low, the cleanliness is high. The cleanliness is named in terms of various standards. One of these standards is to directly name the cleanliness with the number of particles, with sizes greater than or equal to a specified particle size, in a unit volume of air or with a symbol. This naming method is represented by American versions FS-209A-E, which specify the particle size as 0.5 μm and directly name the cleanliness with the concentration of particles, with sizes equal to or greater than 0.5 μm, in air by British system pc/ft3. For instance, level 100, according to this standard, represents that the concentration of particles, with sizes equal to or greater than 0.5 μm, in air is 100 pc/ft3, that is to say, the number of particles, with sizes equal to or greater than 0.5 μm, in each cubic foot of air is 100. Similarly, level 1000 refers to that the number of particles, with sizes equal to or greater than 0.5 μm, in each cubic foot of air is 1000.

In order to monitor and control the cleanliness of air, the amorphous silicon thin film 402 may be placed in a clean room for a reaction. The clean room not only can monitor and control the cleanliness of air, but also can regulate and control the temperature, humidity and the like of the reaction so as to provide a stable reaction environment for the oxidization reaction, and thus, the reproducibility of the reaction is improved, and the process stability is ensured. By controlling the cleanliness during the reaction, foreign particles/ions in the obtained oxide film can be reduced, and thus, the uniformity of the oxide film is improved.

In one embodiment, the reaction temperature of the oxidization reaction may be 21-27° such as 22°, 24° and 26°; the air humidity may be 48-62% such as 50%, 55% and 60%; the reaction time may be 5-8 hours such as 6 hours and 7 hours. The obtained oxide film may have a thickness of 27-32 Å such as 27 Å, 29 Å, 31 Å and 32 Å. The specific reaction time is adaptively selected according to the thickness of the required oxide film.

Figure 6:
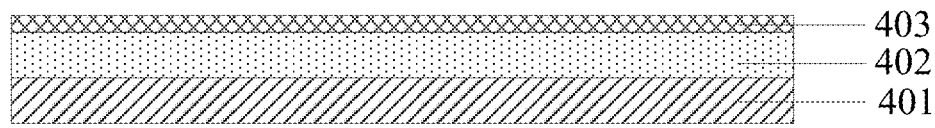
FIG. 6 is a schematic diagram of an oxide film etched through the poly-silicon thin film preparation method of this application.

Referring to FIG. 6, FIG. 6 is a schematic diagram of an oxide film Etched through the poly-silicon thin film preparation method of this application. Etching the oxide film 403 with hydrofluoric acid, and reserving part of the oxide film 403 after etching.

A hydrofluoric acid solution may be sprayed onto the oxide film 403 so as to etch the oxide film 403. Particularly, the concentration of hydrofluoric acid may be 0.21-0.35%/40 s such as 0.25%/40 s and 0.30%/40 s. The conveying speed of the substrate 401 may be 7000-9000 R/min such as 8000 R/min. By controlling the concentration of hydrofluoric acid and the conveying speed of the substrate 401, the etching speed and the left thickness of the oxide film 403 after etching can be controlled.

Figure 7:
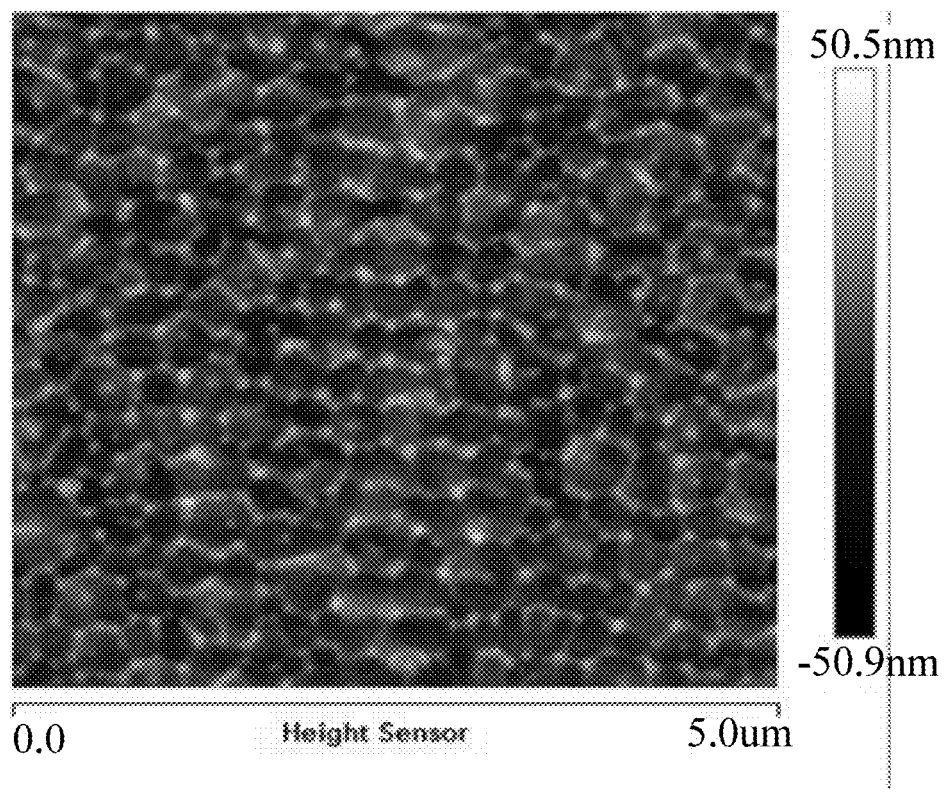
FIG. 7 is a schematic view of a surface of a poly-silicon thin film obtained in this application.

In this method, the concentration of hydrofluoric acid may be lower than that of hydrofluoric acid adopted in existing processes so that the etching speed can be effectively controlled. In other embodiments, the concentration of hydrofluoric acid can be further decreased and the etching time can be prolonged (the etching time is the sum of the setting time of a machine and the conveying time) for etching. The specific etching time depends on the thickness of the oxide film 403. Generally, half of the oxide film 403 may be reserved by thickness, which means that the thickness of the rest of the oxide film 403 may be 12-18 Å such as 13 Å, 15 Å and 17 Å. The roughness R of the rest of the oxide film 403 may be 6.5-8.0 nm such as 6.8 nm, 7.3 nm and 7.8 nm. Referring to FIG. 7, FIG. 7 is a schematic view of a surface of a poly-silicon thin film obtained in this application. The roughness R of the oxide film 403 obtained in this embodiment is 7.3 nm.

Figure 8:
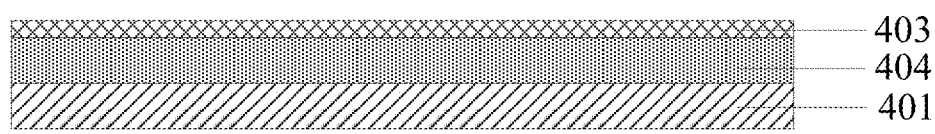
FIG. 8 is a schematic diagram of a poly-silicon thin film formed through the poly-silicon thin film preparation method of this application.

Referring to FIG. 8, FIG. 8 is a schematic diagram of a poly-silicon thin film formed through the poly-silicon thin film preparation method of this application. Carrying out radiation treatment on the amorphous silicon thin film 402 with excimer lasers so as to form a poly-silicon thin film 404.

Before radiation treatment is carried out on the amorphous silicon thin film 402 with excimer lasers, particles on the surface of the substrate 401 need to be removed, and the substrate 401 needs to be dried.

In this embodiment, the amorphous silicon thin film 402 may be retained in air for a period of time, so that the oxide film 403 with a certain thickness is formed on the surface of the amorphous silicon thin film 402. Compared with the existing method for forming an oxide film through oxidization with ozone, this method has a low oxidization speed, which is more beneficial to control over the reaction process, and thus, the oxide film 403 is more uniform; and meanwhile, the cleanliness in the reaction process is controlled, so that foreign particles/ions in the oxide film 403 are reduced, and accordingly, the roughness of the oxide film 403 is reduced. In addition, the concentration of hydrofluoric acid in the etching process is reduced so that the etching speed and uniformity can be controlled, the uniformity of the rest of the oxide film 403 is improved, and accordingly, the roughness is reduced. Besides, the method overcomes the technical prejudice, in this technical field, that a natural oxide layer, having poor uniformity and containing a small quantity of foreign ions, formed in air is not beneficial to the subsequent reaction. Due to the technical prejudice, a naturally-formed oxide film is usually completely etched away with hydrofluoric acid in existing technical solutions, and then a new oxide film is formed; however, this method results in a longer technological preparation process and accordingly increases the cost.

The poly-silicon thin film 404 prepared through the above method can be used to prepare a thin film transistor. This application further provides a preparation method of a thin film transistor. The preparation method may include the following blocks: providing a substrate, and forming a poly-silicon thin film on the substrate, wherein the poly-silicon thin film is prepared through the preparation method mentioned above. Please refer to the description of the above embodiment, and unnecessary details will no long be given herein.

Figure 9:
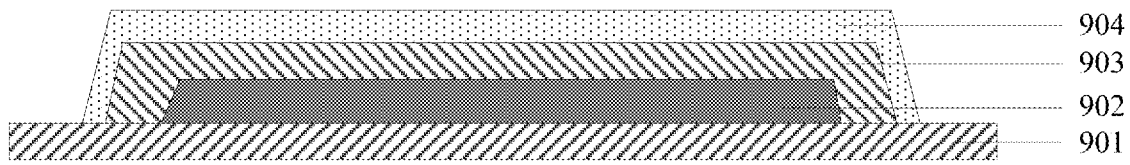
FIG. 9 is a schematic diagram of an amorphous silicon thin film formed through the thin film transistor preparation method of this application.

Referring to FIGS. 9-13, in another embodiment, a preparation method of a thin film transistor may include the following blocks:

Referring to FIG. 9, FIG. 9 is a schematic diagram of an amorphous silicon thin film formed through the thin film transistor preparation method of this application. Forming a light shield layer 902 and a buffer layer 903 on a substrate 901, and forming an amorphous silicon thin film 904 on the buffer layer 903.

Particularly, amorphous silicon and molybdenum may be deposited on the substrate 901 through CVD or physical vapor deposition (PVD) so as to form the light shield layer 902. Then a silicon nitride (SiNx) layer may be deposited on the light shield layer 902 through CVD or PVD, a silicon oxide (SiOx) layer may be deposited on the silicon nitride (SiNx) layer, the silicon nitride (SiNx) layer and the silicon oxide (SiOx) layer form the buffer layer 903. Wherein the silicon nitride (SiNx) layer is mainly used to isolate sodium and potassium ions in the glass substrate, and the silicon oxide (SiOx) layer is mainly used as an insulation layer to improve the contact with a poly-silicon thin film; and then the amorphous silicon thin film 904 may be deposited on the buffer layer 903.

Figure 10:
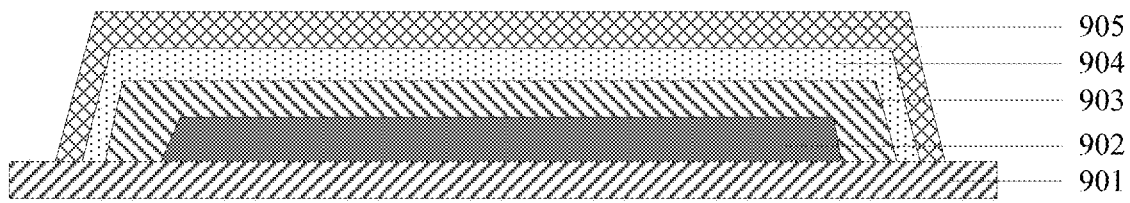
FIG. 10 is a schematic diagram of an oxide film formed through the thin film transistor preparation method of this application.

Referring to FIG. 10, FIG. 10 is a schematic diagram of an oxide film formed through the thin film transistor preparation method of this application. Placing the amorphous silicon film 904 in air for oxidization so as to form an oxide film 905 on the amorphous silicon film 904. Please refer to the description of the above embodiment for the specific implementation process, and unnecessary details will no longer be given herein.

Figure 11:
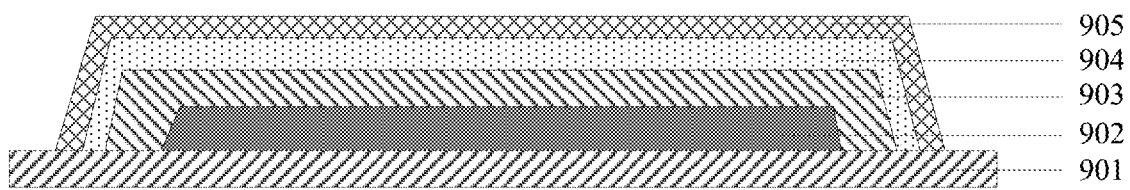
FIG. 11 is a schematic diagram of an oxide film etched through the thin film transistor preparation method of this application.

Referring to FIG. 11, FIG. 11 is a schematic diagram of an oxide film etched through the thin film transistor preparation method of this application. Etching the oxide film 905 with hydrofluoric acid, and reserving part of the oxide film after etching. Please refer to the description of the above embodiment for the specific implementation process, and unnecessary details will no longer be given herein.

Figure 12:
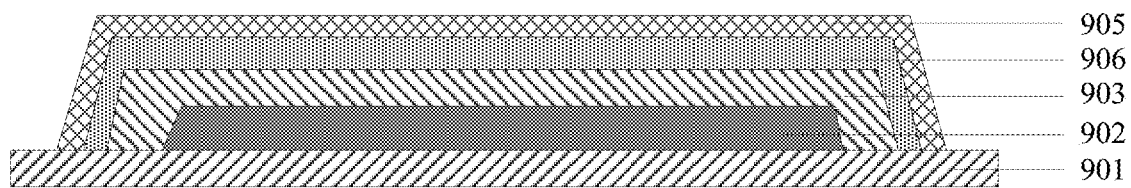
FIG. 12 is a schematic diagram of a poly-silicon thin film formed through the thin film transistor preparation method of this application.

Referring to FIG. 12, FIG. 12 is a schematic diagram of a poly-silicon thin film formed through the thin film transistor preparation method of this application. Carrying out radiation treatment on the amorphous silicon thin film 904 with excimer lasers so as to form a poly-silicon thin film 906. Please refer to the description of the above embodiments for the specific implementation process, and unnecessary details will no longer be given herein.

Carrying out ion doping on the poly-silicon thin film 906, such as N-type doping, P-type doping or the like can be carried on the poly-silicon thin film 906 through existing processes, and there is no limitation in this regard.

Figure 13:
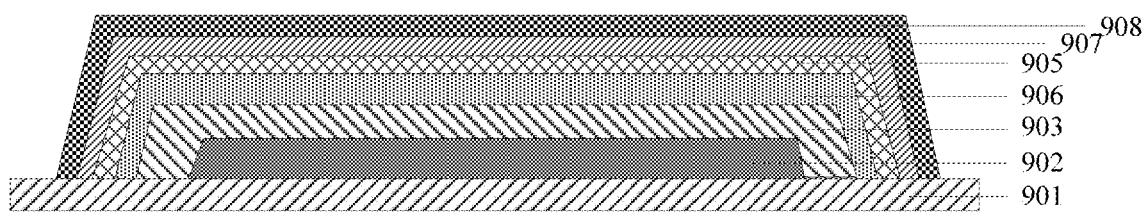
FIG. 13 is a schematic diagram of a gate layer formed through the thin film transistor preparation method of this application.

Referring to FIG. 13, FIG. 13 is a schematic diagram of a gate layer formed through the thin film transistor preparation method of this application. The preparation method may further include the blocks: forming an insulation layer 907, a gate layer 908, a source, a drain and the like on the poly-silicon thin film 906. Wherein the insulation layer 907, the gate layer, the source and the drain can be prepared through existing processes, and there is not limitation in this regard.

Poly-silicon prepared in this embodiment is low in surface roughness, thus, improving the reliability and performance of devices.

The embodiments of the present disclosure provide a preparation method of a poly-silicon thin film, by naturally forming the oxide film in air, the surface roughness of the poly-silicon thin film can be reduced.

The foregoing is merely embodiments of the present disclosure, and is not intended to limit the scope of the present disclosure. Any equivalent structure or flow transformation made based on the specification and the accompanying drawings of the present disclosure, or any direct or indirect applications of the disclosure on other related fields, shall all be covered within the protection of the present disclosure.

What is claimed is:

1. A preparation method of a poly-silicon thin film, comprising:
   providing a substrate, and forming an amorphous silicon thin film on the substrate;
   placing the amorphous silicon thin film in an air environment with a cleanliness smaller than or equal to level 1000 for oxidization so as to form an oxide film on the amorphous silicon thin film; wherein level 1000 refers to that the number of particles, with sizes being equal to or greater than 0.5 μm, in each cubic foot of air is 1000;
   conveying the substrate and spraying a hydrofluoric acid solution onto the oxide film so as to etch the oxide film with hydrofluoric acid, and reserving part of the oxide film after etching, wherein a concentration of hydrofluoric acid is 0.21-0.35%, a conveying speed of the substrate is 7000-9000 R/min; and
   carrying out excimer laser treatment on the amorphous silicon thin film to form a poly-silicon thin film.

2. The preparation method of the poly-silicon thin film according to claim 1, wherein a reaction temperature of the oxidization reaction is 21-27°, an air humidity is 48-62%, and a reaction time is 5-8 hours.

3. The preparation method of the poly-silicon thin film according to claim 1, wherein a roughness R of rest of the oxide film is 6.5-8.0 nm.

4. A preparation method of a poly-silicon thin film, comprising:
   providing a substrate, and forming an amorphous silicon thin film on the substrate;
   placing the amorphous silicon thin film in air for oxidization so as to form an oxide film on the amorphous silicon thin film;
   etching the oxide film with hydrofluoric acid, and reserving part of the oxide film after etching; and
   carrying out excimer laser treatment on the amorphous silicon thin film to form a poly-silicon thin film.

5. The preparation method of the poly-silicon thin film according to claim 4, wherein the placing the amorphous silicon thin film in air for oxidization so as to form an oxide film on the amorphous silicon thin film comprises:
   placing the amorphous silicon thin film in an air environment with a cleanliness smaller than or equal to level 1000 for oxidization; wherein level 1000 refers to that the number of particles, with sizes being equal to or greater than 0.5 μm, in each cubic foot of air is 1000.

6. The preparation method of the poly-silicon thin film according to claim 5, wherein a reaction temperature of the oxidization reaction is 21-27°, an air humidity is 48-62%, and a reaction time is 5-8 hours.

7. The preparation method of the poly-silicon thin film according to claim 4, wherein the etching the oxide film with hydrofluoric acid comprises:
   conveying the substrate and spraying a hydrofluoric acid solution onto the oxide film so as to etch the oxide film; wherein the concentration of hydrofluoric acid is 0.21-0.35%, and a conveying speed of the substrate is 7000-9000 R/min.

8. The preparation method of the poly-silicon thin film according to claim 4, wherein a roughness R of rest of the oxide film is 6.5-8.0 nm.

9. A preparation method of a thin film transistor, comprising:
   providing a substrate, and forming a poly-silicon thin film on the substrate; wherein the forming the poly-silicon thin film on the substrate comprises:
   forming an amorphous silicon thin film on the substrate;
   placing the amorphous silicon thin film in air for oxidization so as to form an oxide film on the amorphous silicon thin film;
   etching the oxide film with hydrofluoric acid, and reserving part of the oxide film after etching; and
   carrying out excimer laser treatment on the amorphous silicon thin film to form the poly-silicon thin film.

10. The preparation method of the thin film transistor according to claim 9, wherein the placing the amorphous silicon thin film in air for oxidization so as to form an oxide film on the amorphous silicon thin film comprises:
    placing the amorphous silicon thin film in an air environment with a cleanliness smaller than or equal to level 1000 for oxidization; wherein level 1000 refers to that the number of particles, with sizes being equal to or greater than 0.5 μm, in each cubic foot of air is 1000.

11. The preparation method of the thin film transistor according to claim 10, wherein a reaction temperature of the oxidization reaction is 21-27°, an air humidity is 48-62%, and a reaction time is 5-8 hours.

12. The preparation method of the thin film transistor according to claim 9, wherein the etching the oxide film with hydrofluoric acid comprises:
    conveying the substrate and spraying a hydrofluoric acid solution onto the oxide film so as to etch the oxide film; wherein the concentration of hydrofluoric acid is 0.21-0.35%, and a conveying speed of the substrate is 7000-9000 R/min.

13. The preparation method of the thin film transistor according to claim 9, wherein a roughness R of rest of the oxide film is 6.5-8.0 nm.

14. The preparation method of the thin film transistor according to claim 9, wherein the forming the amorphous silicon thin film on the substrate comprises:
    forming a light shield layer and a buffer layer on the substrate, and forming the amorphous silicon thin film on the buffer layer.

15. The preparation method of the thin film transistor according to claim 9, carrying out ion doping on the poly-silicon thin film.

16. The preparation method of the thin film transistor according to claim 15, further comprising: forming an insulation layer, a gate layer, a source and a drain on the poly-silicon thin film.

17. The preparation method of the thin film transistor according to claim 14, wherein the forming the buffer layer on the substrate comprises:

forming a silicon nitride layer on the light shield layer;
forming a silicon oxide layer on the silicon nitride layer;
the silicon nitride layer and the silicon oxide layer form the buffer layer.

* * * * *